(12) United States Patent
Liao et al.

(10) Patent No.: US 9,982,348 B2
(45) Date of Patent: May 29, 2018

(54) METHOD OF FORMING PATTERNED METAL UNIT, AND PATTERNED ARTICLE FORMED WITH THE SAME

(71) Applicant: Taiwan Green Point Enterprises Co., Ltd., Taichung (TW)

(72) Inventors: Pen-Yi Liao, Taichung (TW); Hui-Ching Chuang, Taichung (TW); Chih-Hao Chen, Taichung (TW); Jing-Yi Yang, Taichung (TW); Wen-Chia Tsai, Taichung (TW); Yao-Tsung Ho, Taichung (TW)

(73) Assignee: Taiwan Green Point Enterprises Co., Ltd, Taichung (TW)

( * ) Notice: Subject to any disclaimer, the term of this patent is extended or adjusted under 35 U.S.C. 154(b) by 265 days.

(21) Appl. No.: 14/885,509

(22) Filed: Oct. 16, 2015

(65) Prior Publication Data

US 2016/0108525 A1 Apr. 21, 2016

(30) Foreign Application Priority Data

Oct. 17, 2014 (TW) .............................. 103136009 A

(51) Int. Cl.
| | | |
|---|---|---|
| *B44C 1/22* | (2006.01) | |
| *B44C 3/02* | (2006.01) | |
| *B32B 37/02* | (2006.01) | |
| *B32B 38/10* | (2006.01) | |
| *C23C 18/16* | (2006.01) | |
| *C23C 18/20* | (2006.01) | |

(Continued)

(52) U.S. Cl.
CPC ...... *C23C 18/1608* (2013.01); *C23C 18/1612* (2013.01); *C23C 18/1657* (2013.01); *C23C 18/1879* (2013.01); *C23C 18/206* (2013.01); *C23C 18/2086* (2013.01); *C23C 18/31* (2013.01); *B41M 5/38207* (2013.01); *B41M 2205/38* (2013.01); *H05K 3/046* (2013.01); *H05K 3/182* (2013.01); *H05K 2203/0528* (2013.01); *H05K 2203/107* (2013.01)

(58) Field of Classification Search
CPC ............ C23C 18/1608; C23C 18/1879; C23C 18/206; C23C 18/1612; C23C 18/1657; C23C 18/2086; C23C 18/31; H01L 21/4846; H05K 2203/0528; H05K 2203/107; H05K 3/046; H05K 3/182; B41M 2205/38; B41M 5/38207
USPC ......... 156/234, 235, 237, 250, 272.8, 273.3, 156/277, 290, 308.4
See application file for complete search history.

(56) References Cited

U.S. PATENT DOCUMENTS 5,532,105 A * 7/1996 Yamadera ............... G03F 7/095
430/156
7,909,987 B2 * 3/2011 Kurtz ................... B01J 19/0093
208/134

(Continued)

*Primary Examiner* — Sonya Mazumdar
(74) *Attorney, Agent, or Firm* — Volpe and Koenig, P.C.

(57) ABSTRACT

A method of forming a patterned metal unit on an article. The method includes the steps of: providing an article that has an insulating surface; transferring a catalyst layer onto the insulating surface of the article, the catalyst layer including a catalytic material; removing a part of the catalyst layer to form a patterned catalyst layer; and forming a patterned metal layer on the patterned catalyst layer by an electroless plating technique to obtain a patterned metal unit that is constituted by the patterned catalyst layer and the patterned metal layer.

11 Claims, 11 Drawing Sheets

(51) Int. Cl.
*C23C 18/31* (2006.01)
*C23C 18/18* (2006.01)
*B32B 37/06* (2006.01)
*H05K 3/04* (2006.01)
*H05K 3/18* (2006.01)
*B41M 5/382* (2006.01)

(56) References Cited

U.S. PATENT DOCUMENTS

| | | |
|---|---|---|
| 7,927,454 B2 | 4/2011 | Huynh et al. |
| 2004/0101469 A1* | 5/2004 | Demers .................. B82Y 30/00 423/447.3 |
| 2008/0038613 A1* | 2/2008 | Padberg ................. C08J 5/2256 29/831 |
| 2008/0206616 A1* | 8/2008 | Atanassova ............ C09D 11/30 429/479 |
| 2010/0203316 A1* | 8/2010 | Hata ....................... B29C 70/14 428/299.1 |
| 2013/0037312 A1* | 2/2013 | Masuda ................. H05K 3/185 174/257 |

* cited by examiner

METHOD OF FORMING PATTERNED METAL UNIT, AND PATTERNED ARTICLE FORMED WITH THE SAME

CROSS-REFERENCE TO RELATED APPLICATION

This application claims priority of Taiwanese Patent Application No. 103136009, filed on Oct. 17, 2014.

FIELD

Embodiments of the invention generally relate to a method of forming a patterned metal unit, and a patterned article formed with the patterned metal unit.

BACKGROUND

U.S. Pat. No. 7,927,454 B2 discloses a method of forming a metallic material on a receptor, and an article made therefrom. The method includes the steps of: placing a donor element proximate a receptor, the donor element including a donor substrate and a thermal transfer layer that includes a catalytic material and that is placed proximate the receptor; thermally transferring a portion of the thermal transfer layer from the donor element to the receptor; and electrolessly depositing a metallic material on the receptor by growth of the metallic material on the catalytic material. In the step of thermally transferring the portion of the thermal transfer layer, thermal energy may be conducted to the other portion of the thermal transfer layer adjacent to the portion of the thermal transfer layer to be transferred, which may result in poor resolution of the metallic material and short circuiting.

Moreover, it is desirable to form the metallic material with a precise pattern on a non-planar surface, such as a concave surface, a circular surface, a curved surface, etc.

SUMMARY

In certain embodiments of the disclosure, a method of forming a patterned metal unit on an article includes the steps of: providing an article that has an insulating surface; transferring a catalyst layer onto the insulating surface of the article, the catalyst layer including a catalytic material; removing a part of the catalyst layer to form a patterned catalyst layer on the insulating surface of the article; and forming a patterned metal layer on the patterned catalyst layer by an electroless plating technique to obtain a patterned metal unit that is constituted by the patterned catalyst layer and the patterned metal layer.

In certain embodiments of the disclosure, a method of forming a patterned metal unit on an article includes the steps of: providing an article that has an insulating surface; transferring a catalyst layer onto the insulating surface of the article, the catalyst layer including a catalytic material; forming a conductive metal layer on the catalyst layer by an electroless plating technique; and removing a part of the conductive metal layer and a part of the catalyst layer from the article to form a patterned metal layer and a patterned catalyst layer that constitute a patterned metal unit.

In certain embodiments of the disclosure, a patterned article formed with a patterned metal unit includes an article, an adhesive layer, a patterned catalyst layer and a patterned metal layer. The article has an insulating surface formed with a non-planar portion. The adhesive layer is disposed on the insulating surface of the article. The patterned catalyst layer includes a catalytic material and is disposed on the adhesive layer. The patterned metal layer is disposed on the patterned catalyst layer and has a pattern identical to that of the patterned catalyst layer.

BRIEF DESCRIPTION OF THE DRAWINGS

Other features and advantages of the disclosure will become apparent in the following detailed description of the exemplary embodiments with reference to the accompanying drawings, of which.

DETAILED DESCRIPTION OF THE EXEMPLARY EMBODIMENTS

Figure 1:
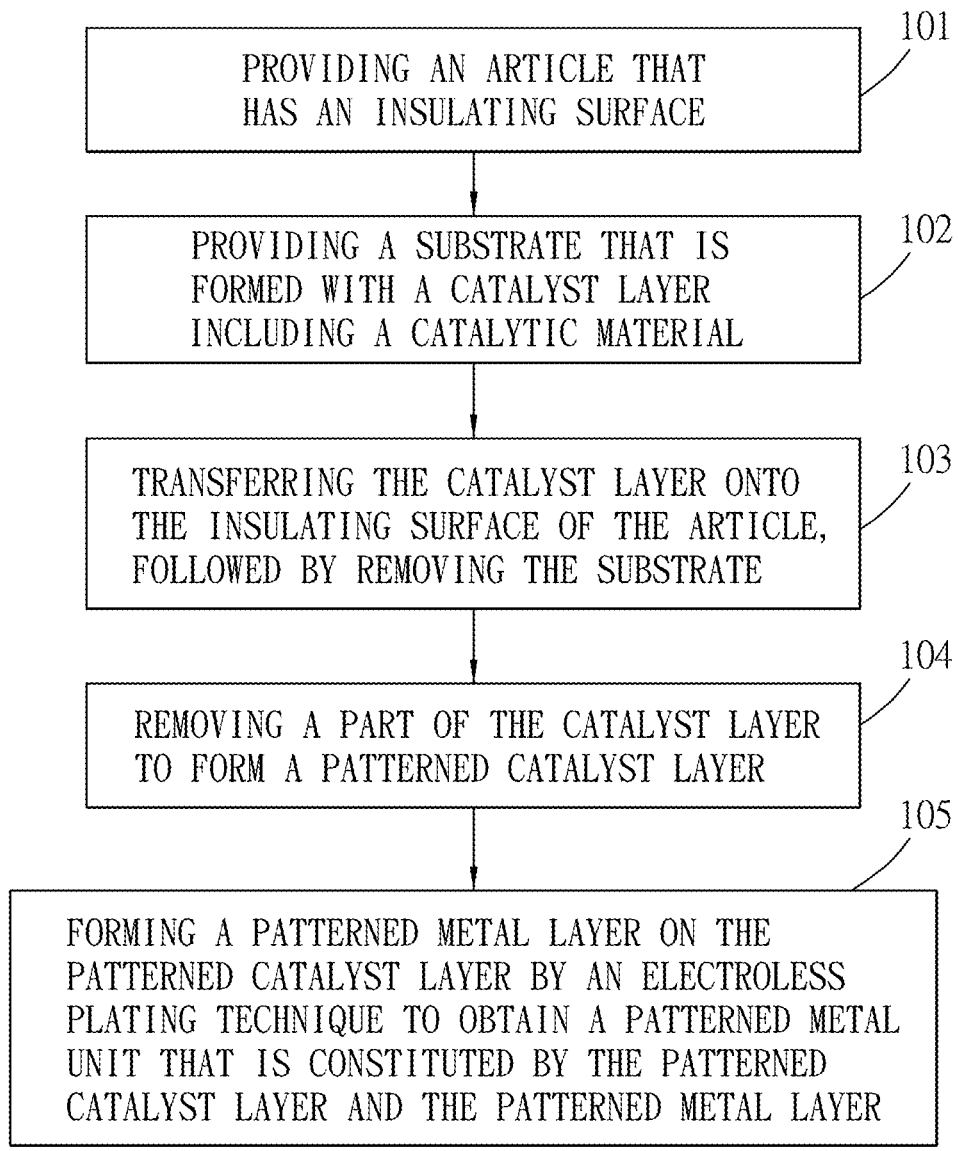
FIG. 1 is a flow chart showing a first embodiment of a method of forming a patterned metal unit on an article according to the present disclosure.

It may be noted that like elements are denoted by the same reference numerals throughout the disclosure.

Figure 2:
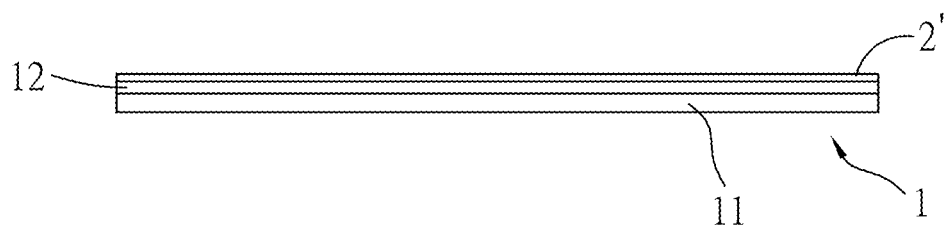
FIGS. 2 to 6 show consecutive steps of the first embodiment.
Figure 3:
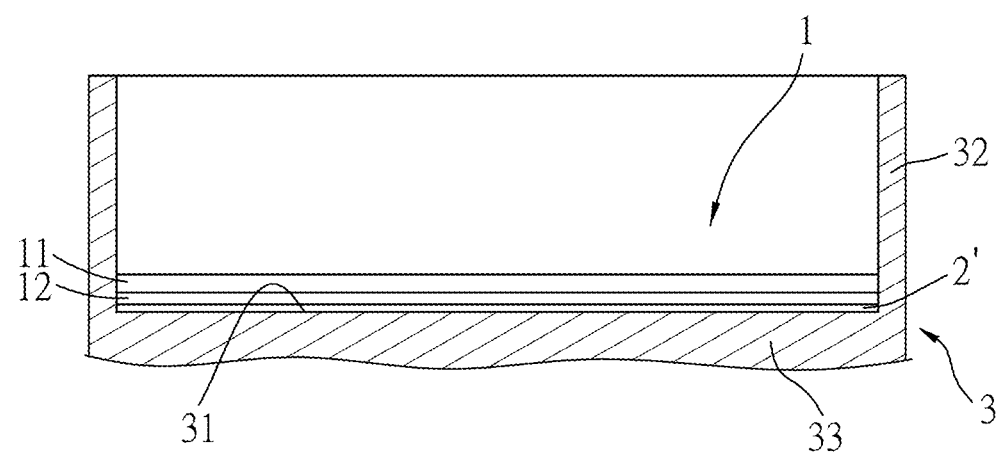
Figure 4:
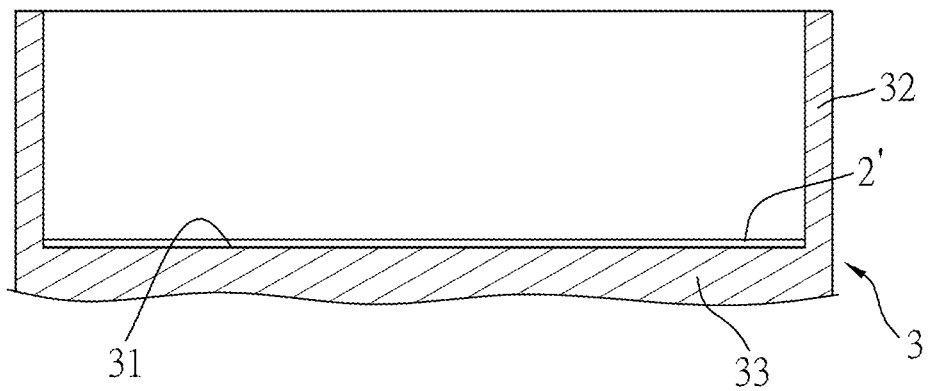
Figure 7:
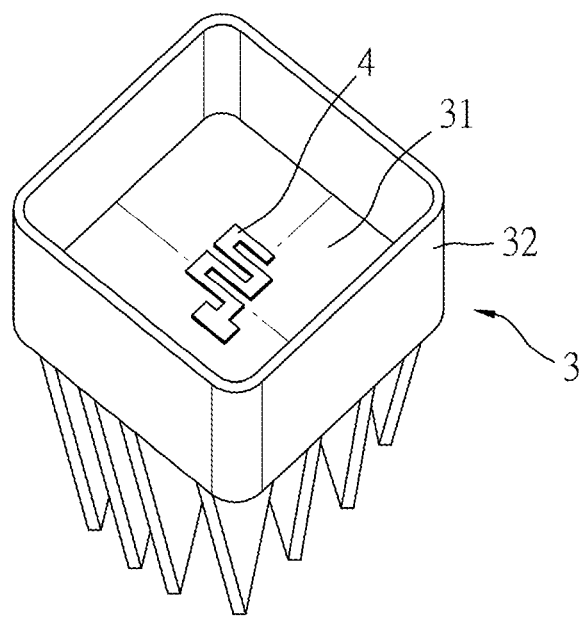
FIG. 7 is a perspective view of a patterned article formed by the first embodiment.
Figure 8:
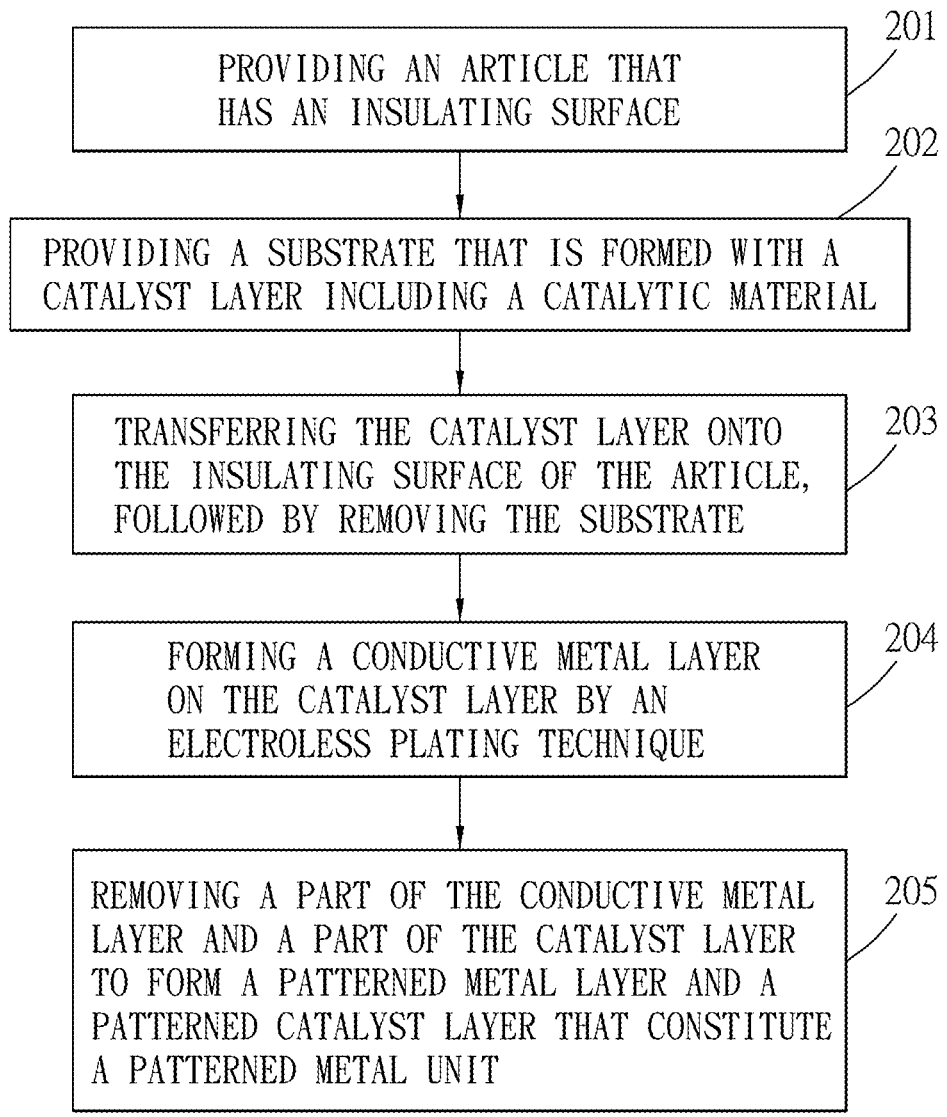
FIG. 8 is a flow chart showing a second embodiment of a method of forming a patterned metal unit on an article according to the present disclosure.

FIGS. 1 to 7 illustrate a first embodiment of a method of forming a patterned metal unit on an article according to the present disclosure. The method includes the following steps:

Step 101: providing an article 3 that has an insulating surface 31 (see FIG. 3);

Step 102: providing a substrate 1 that is formed with a catalyst layer 2' including a catalytic material (see FIG. 2);

Step 103: transferring the catalyst layer 2' onto the insulating surface 31 of the article 3, followed by removing the substrate 1 (see FIGS. 3 and 4);

Step 104: removing a part of the catalyst layer 2' to form a patterned catalyst layer 2 on the insulating surface 31 of the article 3 (see FIG. 5); and forming a patterned metal layer 4 on the patterned catalyst layer 2 by an electroless plating technique to obtain a patterned metal unit that is constituted by the patterned catalyst layer 2 and the patterned metal layer (Step 105). As shown in FIG. 7, a patterned article is thus obtained.

As shown in FIG. 3, in certain embodiments, the article 3 is non-planar and includes a base 33 and a sidewall 32 surrounding the base 33. The base 33 includes a metal layer (not shown) and an insulating layer (not shown) that is formed on the metal layer and that has the insulating surface 31. The sidewall 32 surrounds the insulating surface 31. The article 3 may be a lamp holder for a car (see FIG. 7). The insulating layer may be made of an epoxy resin or a ceramic material coated on the metal layer. In certain embodiments, the article 3 may be directly made of an insulating material, so that the metal layer can be dispensed with and the procedure of forming the insulating layer on the metal layer can be omitted.

As shown in FIG. 2, the substrate 1 includes a base layer 11 and a release film 12 that is formed between the base layer 11 and the catalyst layer 2' and that facilitates removal of the base layer 11 from the catalyst layer 2' in Step 103. In certain embodiments, the base layer 11 is flexible and may be made of polyethylene terephthalate (PET), propylene oxide (PO), etc. The release film 12 may be made of a silicone material such as silicone resin, silicone oil, etc. Since the base layer 11 is flexible, the catalyst layer 2' can be transferred and fittingly attached onto the article 3.

Note that, since the base layer 11 is flexible and can be attached to a non-planar surface, the insulating surface 31 of the article 3 may be a non-planar surface and may be formed with a non-planar portion (i.e., at least apart of the insulating surface 31 is non-planar) that has a curved shape (see FIGS. 14 to 18).

The catalyst layer 2' may be made of ink that contains a catalytic material capable of catalyzing an electroless plating process. The catalytic material may be metal, a metal salt, a metal complex or combinations thereof. Examples of the metal include, but are not limited to, palladium, thallium, aluminum, scandium, titanium, vanadium, manganese and combinations thereof. Examples of the metal salt include, but are not limited to, a palladium salt, a platinum salt, a silver salt and combinations thereof. The ink containing the catalytic material may be applied to the substrate 1 by a spray coating technique or a screen printing technique to form the catalyst layer 2', which may have a thickness ranging from 15 μm to 60 μm. Note that the technique for applying the ink to the substrate 1 is not limited to spray coating or screen printing, and may be changed according to practical requirements.

As shown in FIGS. 3 and 4, in Step 103, an assembly of the substrate 1 and the catalyst layer 2' is pressed against the article 3 with the catalyst layer 2' in contact with the insulating surface 31 of the article 3. The entire catalyst layer 2' is then thermally transferred onto the insulating surface 31 of the article 3. The thermal transfer process of the catalyst layer 2' may be conducted by a hot pressing machine (not shown), under a pressure ranging from 6 Kg to 6.5 Kg, and a temperature ranging from 130° C. to 140° C. Then, the substrate 1 is removed.

Figure 5:
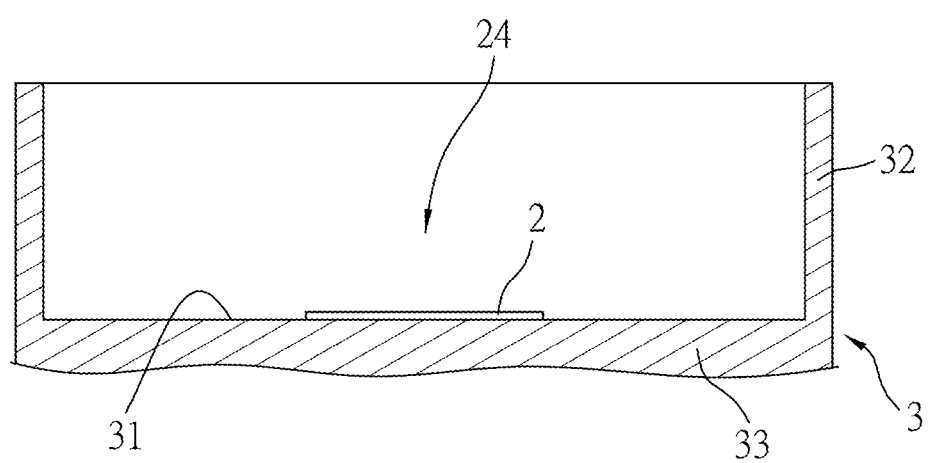

In Step 104, the part of the catalyst layer 2' is removed by laser cutting to form a patterned catalyst layer 2. Specifically, as shown in FIG. 5, the catalyst layer 2' may be defined to have a plating region 24 on which the patterned metal layer 4 is to be formed. Step 104 is performed by removing the catalyst layer 2' other than the plating region 24. A laser cutting machine (not shown) used in Step 104 may have a minimum resolution of 0.3 mm line-spacing and 0.2 mm line-width. Note that the size of the laser beam used in the laser cutting process may be adjusted according to the width of the patterned metal layer 4, thereby achieving precise definition of the patterned metal layer 4. Moreover, the energy of the laser may also be adjusted according to the material of the catalyst layer 2', thereby ensuring complete and precise removal of the part of the catalyst layer 2'. In addition, the use of laser would prevent formation of burr. Alternatively, in certain embodiments, Step 104 may be conducted by a computerized numerical control (CNC) cutting machine.

Figure 6:
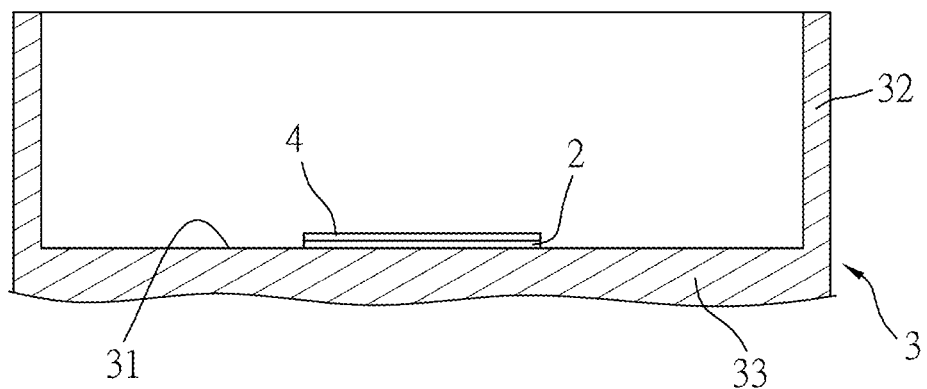

In Step 105, the patterned metal layer 4 may be made of copper, nickel, gold, silver, palladium, rhodium, tin, cobalt, etc., and has a pattern identical to that of the patterned catalyst layer 2 (see FIG. 6). Note that, after the patterned metal layer 4 is electrolessly formed, the thickness of the patterned metal layer 4 may be increased by a subsequent electroplating process according to practical requirements.

According to the first embodiment of the present disclosure, the patterned metal unit may be formed on the article 3 with the non-planar surface 31.

Figure 9:
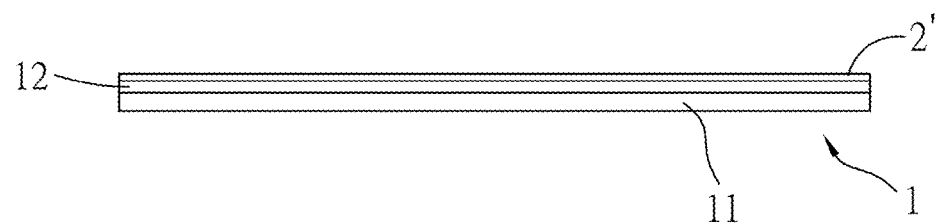
FIGS. 9 to 12 show consecutive steps of the second embodiment.
Figure 10:
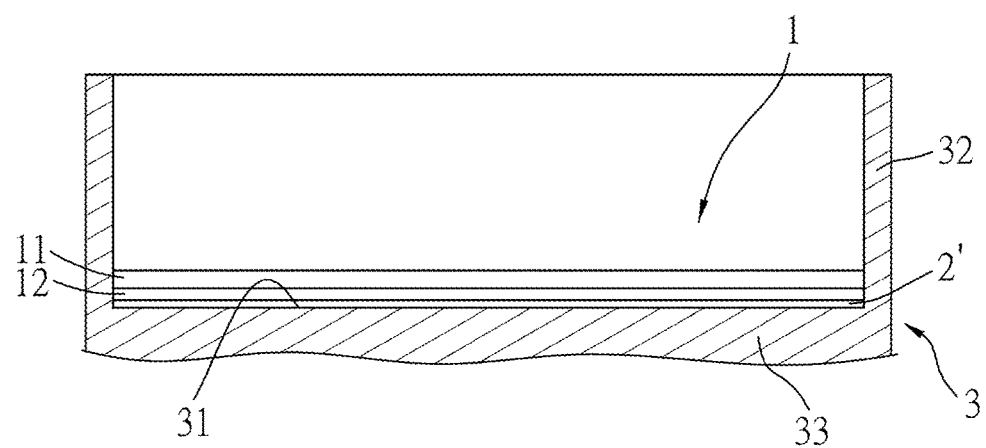
Figure 11:
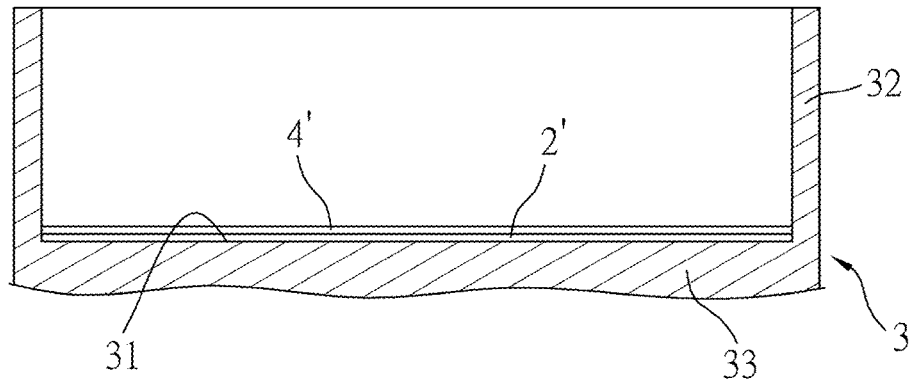
Figure 12:
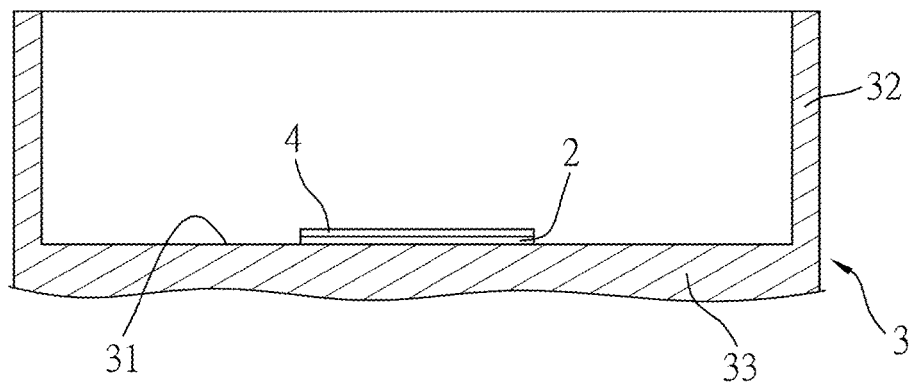
Figure 13:
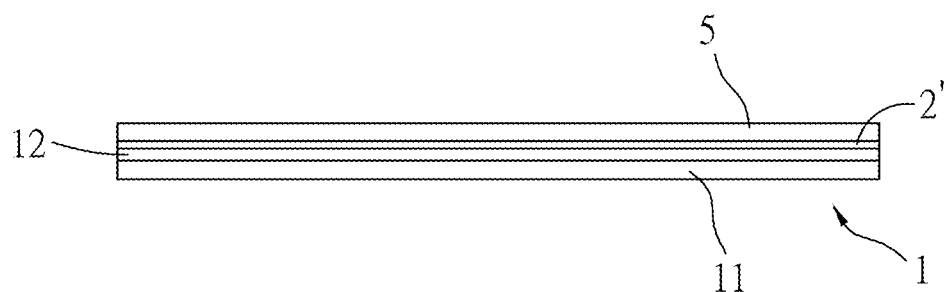
FIGS. 13 to 17 show consecutive steps of the third embodiment of a method of forming a patterned metal unit on an article according to the present disclosure.
Figure 14:
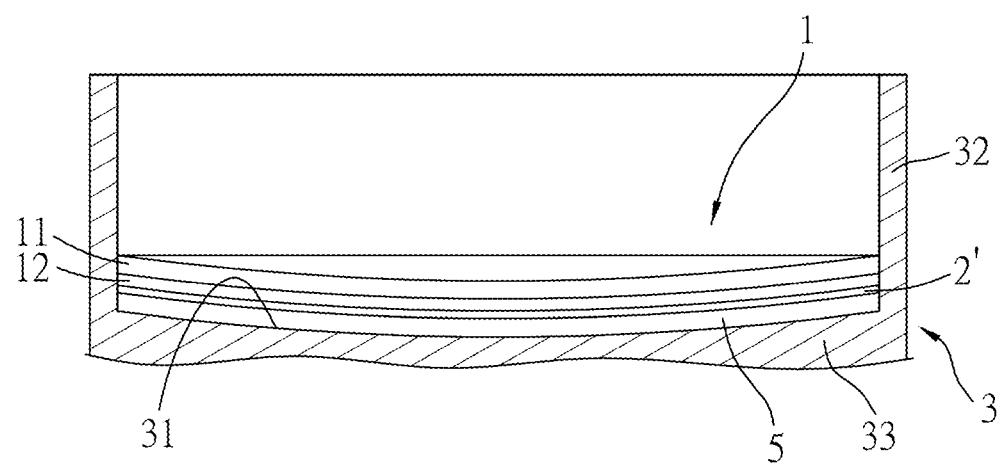
Figure 15:
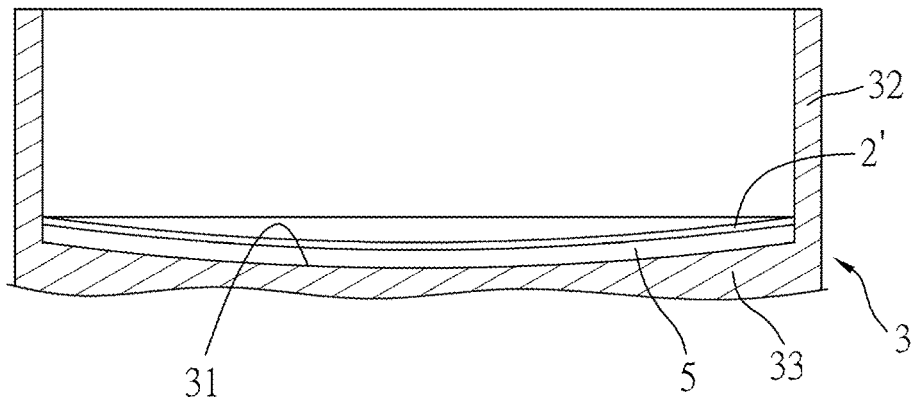
Figure 16:
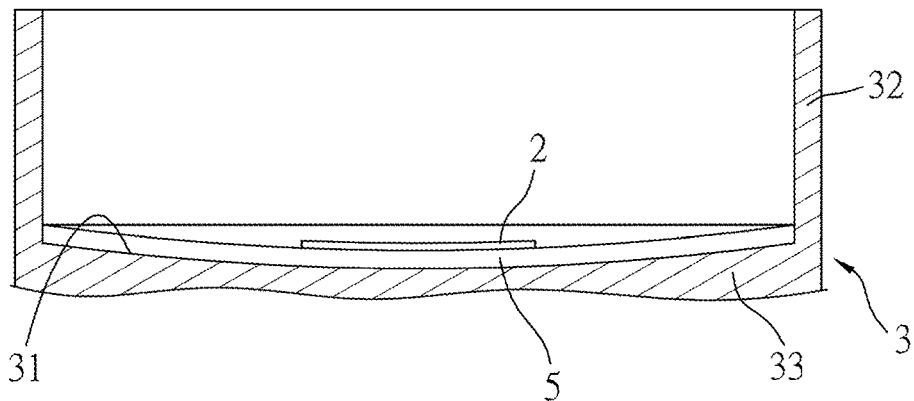

FIGS. 8 to 12 illustrate a second embodiment of a method of forming a patterned metal unit on an article according to the present disclosure. The method includes the following steps:

Step 201: providing an article 3 that has an insulating surface 31 (see FIG. 10);

Step 202: providing a substrate 1 that is formed with a catalyst layer 2' including a catalytic material (see FIG. 9);

Step 203: transferring the catalyst layer 2' onto the insulating surface 31 of the article 3, followed by removing the substrate 1 (see FIG. 10);

Step 204: forming a conductive metal layer 4' on the catalyst layer 2' by the electroless plating technique (see FIG. 11); and Step 205: removing a part of the conductive metal layer 4' and a part of the catalyst layer 2' from the article 3 to form a patterned metal layer 4 and a patterned catalyst layer 2 that constitute a patterned metal unit on the article 3 (see FIG. 12).

The second embodiment is similar to the first embodiment except for the differences described below. In the first embodiment, the catalyst layer 2' is first treated to form the patterned catalyst layer 2, followed by forming the patterned metal layer 4 on the patterned catalyst layer 2. In contrast, in the second embodiment, the conductive metal layer 4' is first formed on the untreated catalyst layer 2', followed by removing the part of the conductive metal layer 4' and the part of the catalyst layer 2' so as to form the patterned metal layer 4 and the patterned catalyst layer 2.

FIGS. 13 to 18 illustrate a third embodiment of the method of forming the patterned metal unit on the article according to the present disclosure. The third embodiment is similar to the first embodiment, with the differences residing in that, in step 102 of the third embodiment, an adhesive layer 5 is provided on the catalyst layer 2' (see FIG. 13) opposite to the substrate 1, and, in Step 103 of the third embodiment, the catalyst layer 2' is transferred and adhered to the insulating surface 31 of the article 3 via the adhesive layer 5 (see FIG. 14). Removal of the substrate 1 (FIG. 15), removal of the part of the catalyst layer 2' (FIG. 16), and formation of the patterned metal layer 4 (FIG. 17) in the third embodiment are the same as those of the first embodiment. The adhesive layer 5 can be used in the circumstance that the catalyst layer 2' is incapable of thermally transferring onto the article 3.

Figure 17:
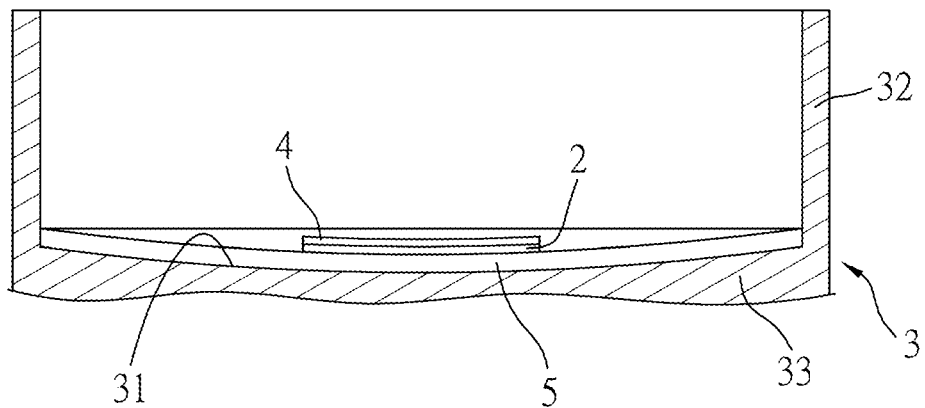
Figure 18:
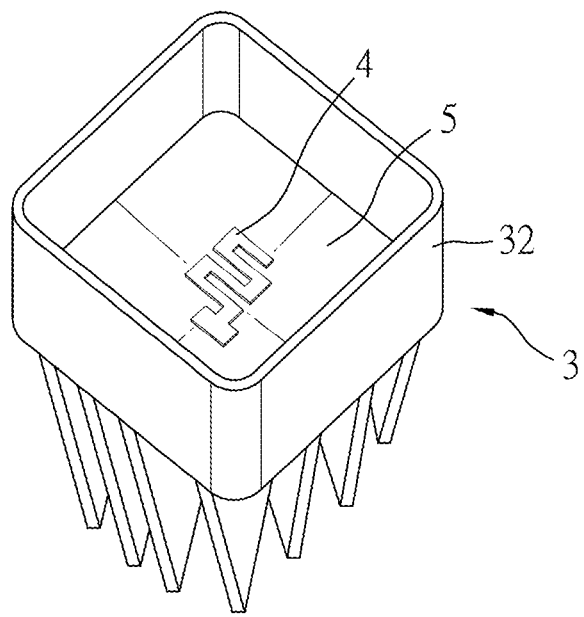
FIG. 18 is a perspective view of a patterned article formed by the third embodiment.

As shown in FIGS. 17 and 18, a patterned article made by the method of the third embodiment includes the article 3, the adhesive layer 5, the patterned catalyst layer 2 and the patterned metal layer 4. The article 3 has the insulating surface 31 formed with the non-planar portion, and includes a sidewall 32 surrounding the insulating surface 31. In this embodiment, the non-planar portion has a curved shape. The adhesive layer 5 is disposed on the insulating surface of the article 3. The patterned catalyst layer 2 includes catalyst metal and is disposed on the adhesive layer 5. The patterned metal layer 4 is disposed on the patterned catalyst layer and has the pattern identical to that of the patterned catalyst layer 2.

Figure 19:
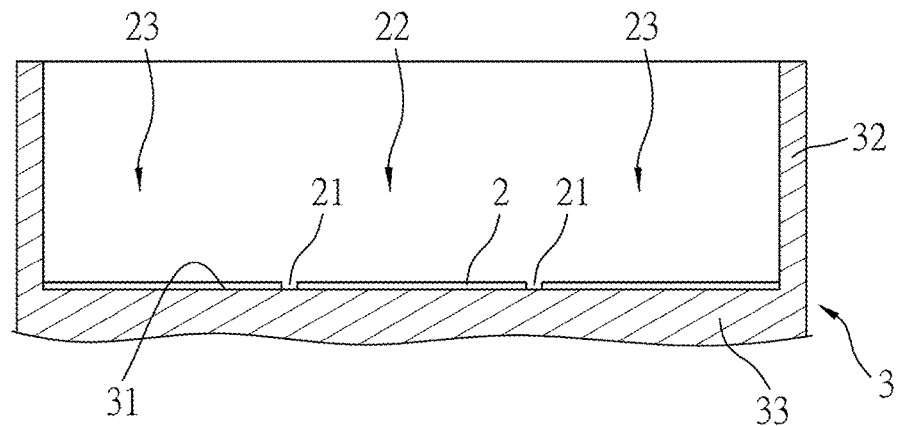
FIGS. 19 and 20 show consecutive steps of a fourth embodiment of a method of forming a patterned metal unit on an article according to the present disclosure.
Figure 20:
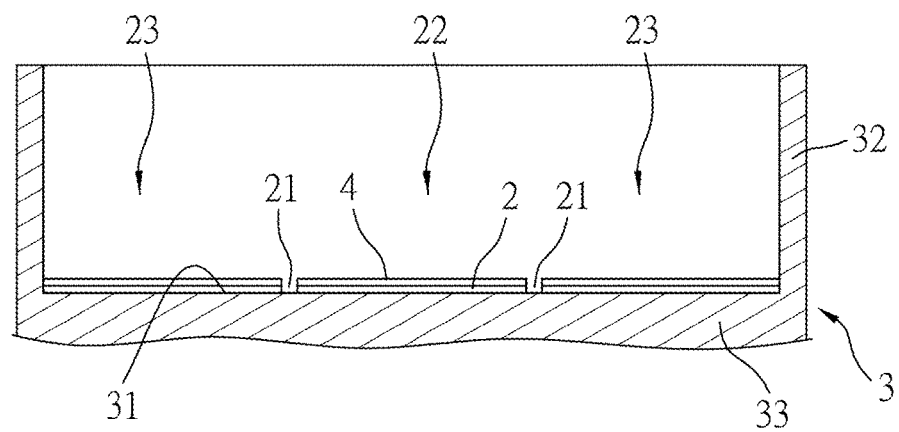

FIGS. 19 and 20 illustrate a fourth embodiment of the method of forming the patterned metal unit on the article according to the present disclosure. The fourth embodiment is similar to the first embodiment, with the differences residing in that, in Step 104 of the fourth embodiment, the part of the catalyst layer 2' is removed to form an isolation channel 21 dividing the remainder of the catalyst layer 2' into the first plating region 22 and a second plating region 23 that is separated from the first plating region 22 by the isolation channel 21 (see FIG. 19). In Step 105, the patterned metal layer 4 is formed on the first and second plating region 22, 23, and the patterned metal layer 4 on the first plating region 22 is separated and electrically insulated from the patterned metal layer 4 on the second plating region 23 by the isolation channel 21. Therefore, the patterned metal layer 4 on the second plating region 23 would not affect the function (e.g., function as an electrical wiring structure) of the patterned metal layer 4 on the first plating region 22, and does not need to be removed, thereby saving manufacturing time.

The four embodiments described above are all capable of forming the patterned metal unit on the article 3, and provide alternatives that can be chosen based on actual requirements.

To sum up, with the transferring and removing steps of the method of this disclosure, the patterned metal layer 4 can be formed with a precise pattern and on the non-planar surface 31 of the article 3.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A method of forming a patterned metal unit on an article, comprising the steps of:
   providing an article that has an insulating surface, at least a part of the insulating surface of the article being non-planar;
   transferring a catalyst layer onto the insulating surface of the article, the catalyst layer including a catalytic material;
   removing a part of the catalyst layer to form a patterned catalyst layer on the insulating surface of the article; and
   forming a patterned metal layer on the patterned catalyst layer by an electroless plating technique to obtain a patterned metal unit that is constituted by the patterned catalyst layer and the patterned metal layer.

2. The method as claimed in claim 1, further comprising a step of, before the transferring step, providing a substrate that is formed with the catalyst layer,
   wherein, in the transferring step, the substrate is removed after the catalyst layer being transferred onto the insulating surface of the article.

3. The method as claimed in claim 2, wherein the substrate includes a base layer and a release film that is formed between the base layer and the catalyst layer and that facilitates removal of the base layer from the catalyst layer in the transferring step.

4. The method as claimed in claim 2, wherein the substrate is flexible.

5. The method as claimed in claim 2, wherein the article includes a sidewall surrounding the insulating surface.

6. The method as claimed in claim 2, wherein the catalyst layer has a thickness ranging from 15 μm to 60 μm.

7. The method as claimed in claim 1, wherein, in the removing step, the part of the catalyst layer is removed by laser cutting.

8. The method as claimed in claim 1, further comprising a step of, before the transferring step, providing the catalyst layer and an adhesive layer that is formed on the catalyst layer,
   wherein, in the transferring step, the catalyst layer is transferred and adhered to the insulating surface of the article via the adhesive layer.

9. The method as claimed in claim 1, wherein the article includes a metal layer, and an insulating layer that is formed on the metal layer and that has the insulating surface.

10. The method as claimed in claim 1, wherein the catalyst layer is defined to have a plating region on which the patterned metal layer is to be formed, and the removing step is performed by removing the catalyst layer other than the plating region.

11. The method as claimed in claim 1, wherein, in the removing step, the part of the catalyst layer is removed to form an isolation channel dividing the remainder of the catalyst layer into a first plating region and a second plating region that is separated from the first plating region by the isolation channel.

* * * * *